(12) United States Patent
Han

(10) Patent No.: US 10,312,205 B2
(45) Date of Patent: Jun. 4, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventor: Youn Gyu Han, Suwon-si (KR)

(73) Assignee: Samsung Electro-Mechanics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/606,467

(22) Filed: May 26, 2017

(65) Prior Publication Data

US 2017/0373027 A1 Dec. 28, 2017

(30) Foreign Application Priority Data

Jun. 23, 2016 (KR) .................. 10-2016-0078778
Sep. 2, 2016 (KR) .................. 10-2016-0113001

(51) Int. Cl.
*H01L 23/00* (2006.01)
*H01L 21/56* (2006.01)
*H01L 23/367* (2006.01)

(52) U.S. Cl.
CPC ............ *H01L 24/05* (2013.01); *H01L 21/568* (2013.01); *H01L 23/367* (2013.01); *H01L 24/01* (2013.01); *H01L 24/02* (2013.01); *H01L 24/13* (2013.01); *H01L 24/19* (2013.01); *H01L 2224/024* (2013.01); *H01L 2224/0239* (2013.01); *H01L 2224/02311* (2013.01); *H01L 2224/02379* (2013.01); *H01L 2224/02381* (2013.01); *H01L 2224/0401* (2013.01); *H01L 2224/04105* (2013.01); *H01L 2224/05025* (2013.01);

(Continued)

(58) Field of Classification Search
CPC ....................................................... H01L 24/01
USPC ........................................................ 257/737
See application file for complete search history.

(56) References Cited

U.S. PATENT DOCUMENTS 9,799,620 B2 * 10/2017 Huang .............. H01L 23/49827
2004/0038021 A1 2/2004 Nagai et al.
(Continued)

FOREIGN PATENT DOCUMENTS

JP 06-204355 A 7/1994
JP 2004-87637 A 3/2004
(Continued)

OTHER PUBLICATIONS

Taiwanese Office Action issued in corresponding Taiwanese Patent Application No. 106116937, dated Mar. 31, 2018, with English Translation.
(Continued)

*Primary Examiner* — David Vu
*Assistant Examiner* — Brandon C Fox
(74) *Attorney, Agent, or Firm* — Morgan, Lewis & Bockius LLP

(57) ABSTRACT

A fan-out semiconductor package includes a semiconductor chip having an active surface, the active surface having a connection pad disposed thereon, and an inactive surface opposing the active surface; an encapsulant encapsulating at least a portion of the semiconductor chip; an insulating layer disposed on the active surface of the semiconductor chip; and a redistribution layer disposed on the insulating layer and electrically connected to the connection pad. The insulating layer includes a low tan delta (Df) dielectric material.

10 Claims, 12 Drawing Sheets

(52) U.S. Cl.
CPC ............... *H01L 2224/05569* (2013.01); *H01L 2224/12105* (2013.01); *H01L 2224/13024* (2013.01); *H01L 2224/16227* (2013.01); *H01L 2224/32225* (2013.01); *H01L 2224/73204* (2013.01); *H01L 2924/01029* (2013.01); *H01L 2924/15311* (2013.01); *H01L 2924/18162* (2013.01)

(56) References Cited

U.S. PATENT DOCUMENTS

| | | | |
|---|---|---|---|
| 2010/0213599 A1 | 8/2010 | Watanabe et al. | |
| 2011/0308848 A1* | 12/2011 | Ito | H05K 3/045 |
| | | | 174/260 |
| 2012/0038044 A1* | 2/2012 | Chang | H01L 24/19 |
| | | | 257/738 |
| 2013/0341784 A1 | 12/2013 | Lin et al. | |
| 2015/0123269 A1* | 5/2015 | Chen | H01L 23/562 |
| | | | 257/737 |
| 2015/0179616 A1* | 6/2015 | Lin | H01L 25/50 |
| | | | 257/773 |
| 2015/0303158 A1 | 10/2015 | Huang et al. | |
| 2016/0093580 A1* | 3/2016 | Scanlan | H01L 23/48 |
| | | | 257/737 |
| 2016/0218063 A1* | 7/2016 | Tsai | H01L 23/3114 |
| 2017/0243826 A1* | 8/2017 | Lin | H01L 21/4853 |

FOREIGN PATENT DOCUMENTS

| | | |
|---|---|---|
| JP | 2010-219489 A | 9/2010 |
| KR | 10-2010-0024668 A | 3/2010 |
| KR | 10-2015-0101722 A | 9/2015 |
| TW | 201401466 A | 1/2014 |

OTHER PUBLICATIONS

Office Action issued in corresponding Korean Patent Application No. 10-2016-0113001, dated Jul. 31, 2018.

* cited by examiner

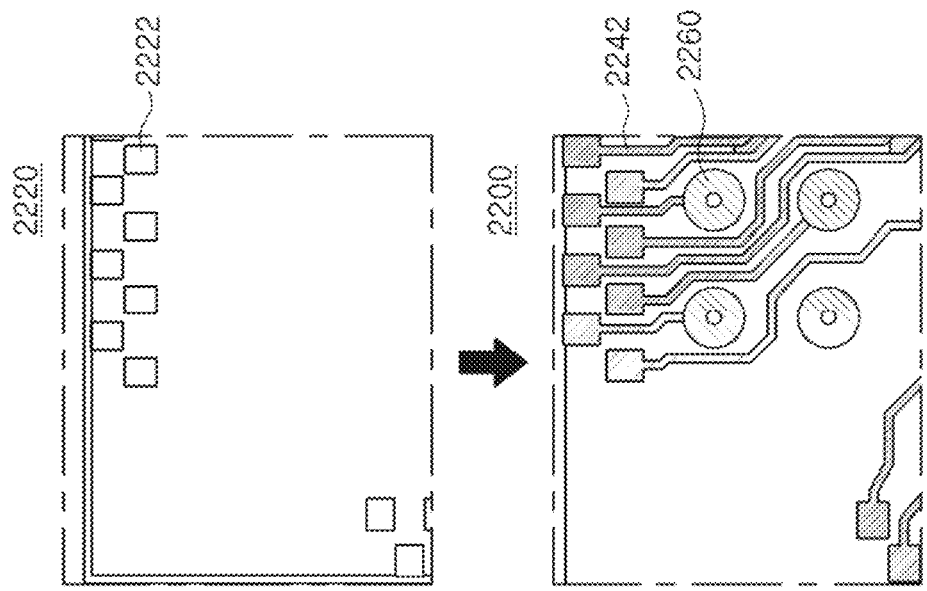
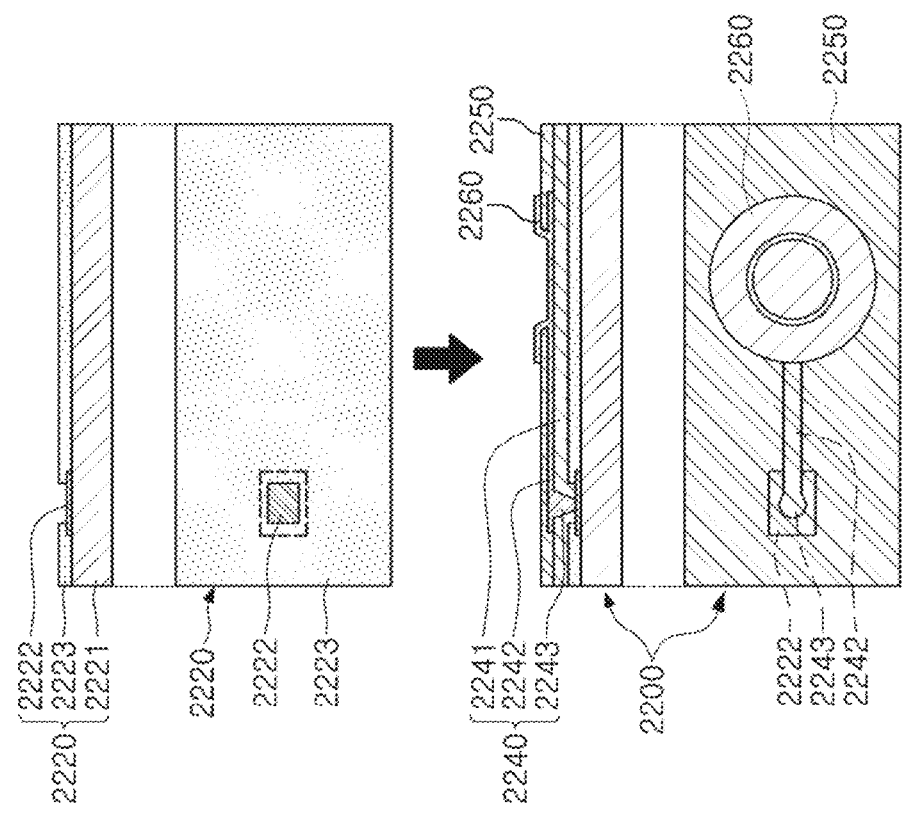
FIG. 3A
FIG. 3B

I - I'

FAN-OUT SEMICONDUCTOR PACKAGE

CROSS-REFERENCE TO RELATED APPLICATION

This application claims the benefit of priority to Korean Patent Application Nos. 10-2016-0078778, filed on Jun. 23, 2016 and 10-2016-0113001, filed on Sep. 2, 2016 with the Korean Intellectual Property Office, the entirety of which is incorporated herein by reference.

BACKGROUND

The present disclosure relates to a semiconductor package and, more particularly, to a fan-out semiconductor package, in which connection terminals may be extended outwardly of a region in which a semiconductor element is disposed.

In order to increase the performance of electronic device systems, it may be very important to implement inter-large scale IC (LSI) high-speed signal transmission, while speeding up transmission of signals inside LSIs. A recent trend towards high-end packages has spawned the development of wafer level packages (WLP) or the like, in which chips are embedded inwardly of distribution layers to speed up and stabilize signal transmission.

WLPs or the like refer to semiconductor packages having characteristics such as high speed, as well as compact size, reduced thickness, and high density. However, it may be difficult to reduce the loss of signals, which increases as the signals' transmission speed increases, using current structures of WLPs or through-substrate vias (TSVs) and insulating materials used therein.

SUMMARY

An aspect of the present disclosure may provide a fan-out semiconductor package which may apply to high-end products by reducing noise in signal transmission.

An aspect of the present disclosure may provide a fan-out semiconductor package which may reduce signal loss by introducing a low Df dielectric material as a material of an insulating layer in which a redistribution layer is formed.

According to an aspect of the present disclosure, the fan-out semiconductor package may include: a semiconductor chip having an active surface, the active surface having a connection pad disposed thereon, and an inactive surface opposing the active surface; an encapsulant encapsulating at least a portion of the semiconductor chip; an insulating layer disposed on the active surface of the semiconductor chip; and a redistribution layer disposed on the insulating layer and electrically connected to the connection pad. The insulating layer may include a low Df dielectric material.

BRIEF DESCRIPTION OF DRAWINGS

The above and other aspects, features, and advantages of the present disclosure will be more clearly understood from the following detailed description, taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
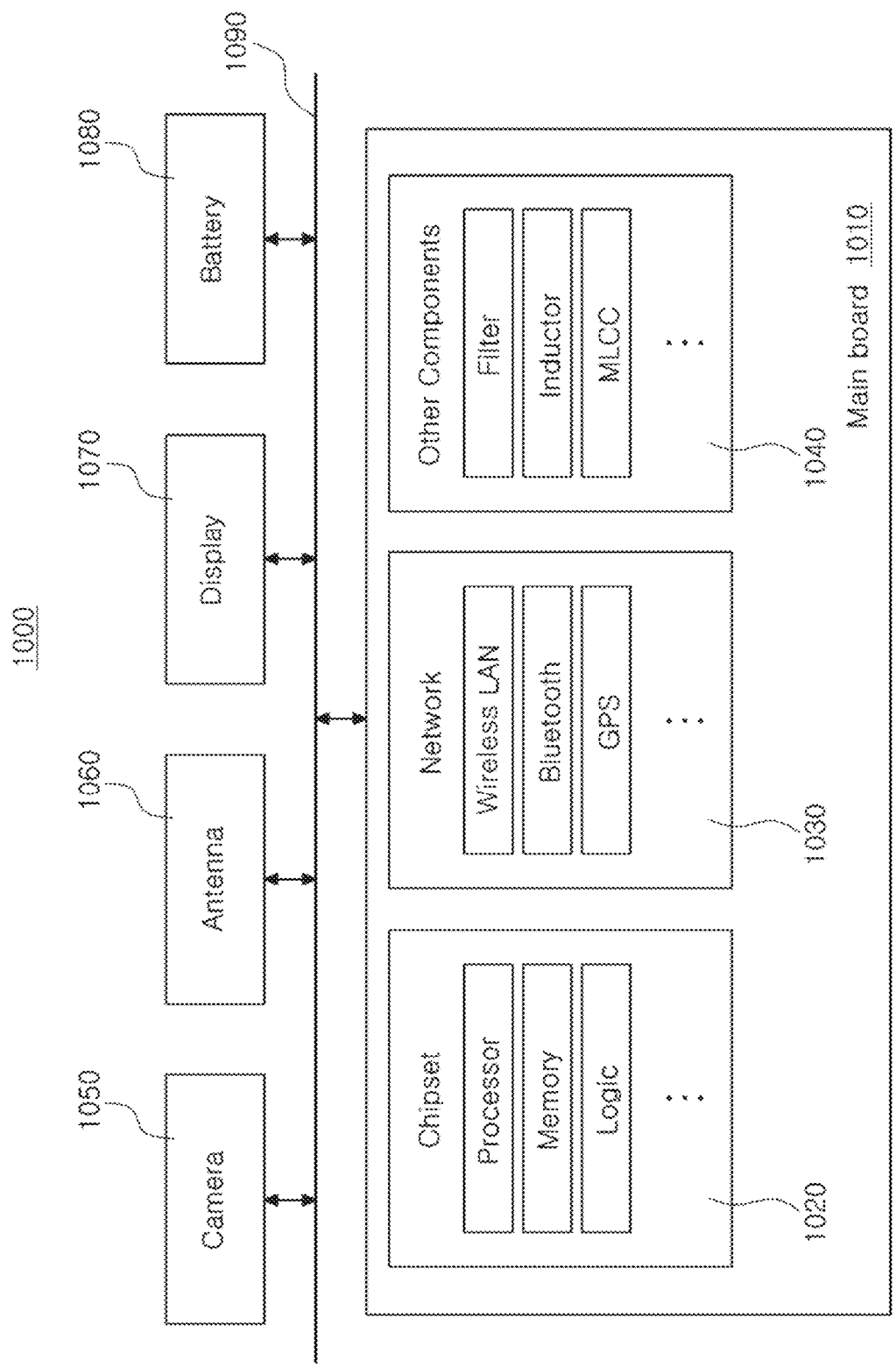
FIG. 1 is a schematic block diagram illustrating an example of an electronic device system.

Hereinafter, embodiments of the present disclosure will be described with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated, listed items.

It will be apparent that, although the terms 'first,' 'second,' 'third,' etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s), as shown in the figures. It will be understood that the spatially relative terms are intended to encompass different orientations of the device in use or operation, in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations, depending on a particular directional orientation of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted alone or as a combination of several.

The contents of the present disclosure described below may have a variety of configurations, and only a required configuration is proposed herein, but the present disclosure is not limited thereto.

Electronic Device

FIG. 1 is a schematic block diagram illustrating an example of an electronic device system.

Referring to FIG. 1, an electronic device 1000 may accommodate a main board 1010. The main board 1010 may include chip-related components 1020, network-related components 1030, other components 1040, and the like, physically or electrically connected thereto. These components may be connected to other components, to be described below, to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip-related components 1020 are not limited thereto, and may include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network-related components 1030 are not limited thereto, and may include a variety of other wireless or wired standards or protocols. In addition, the network-related components 1030 maybe combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device able to process data.

Figure 2:
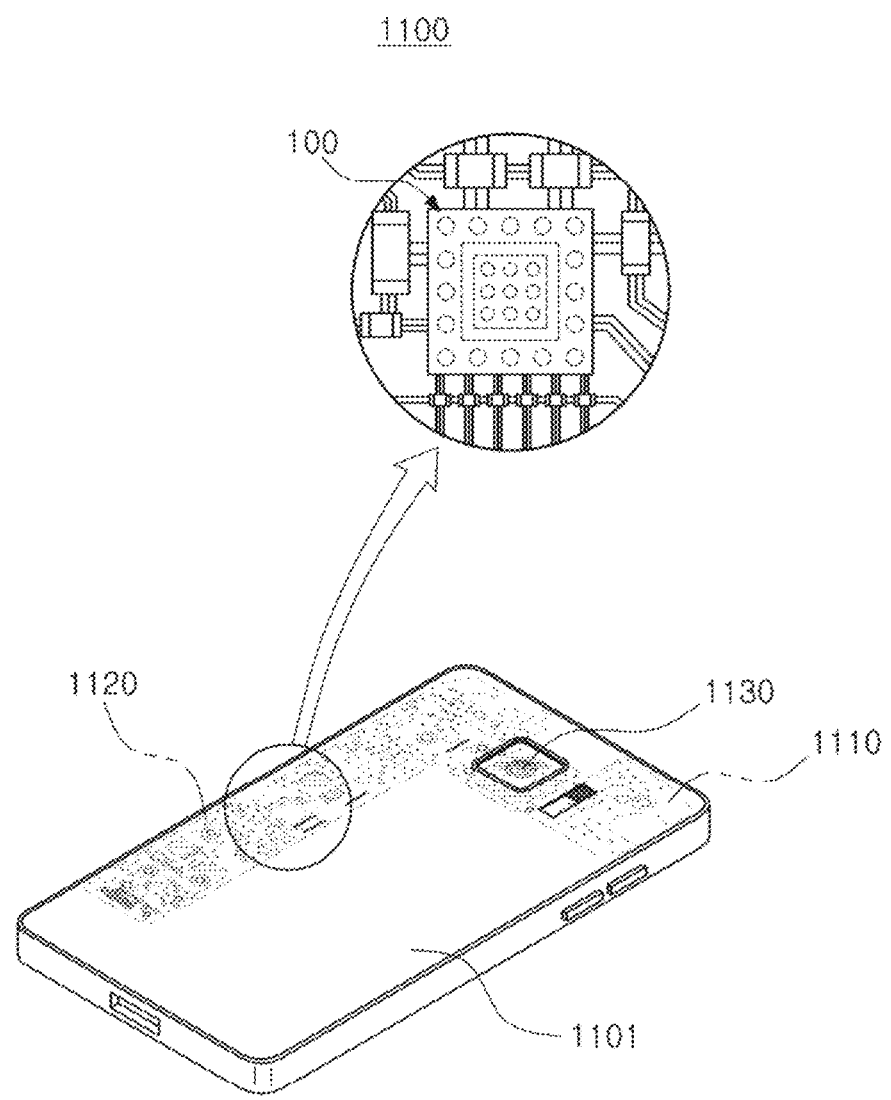
FIG. 2 is a schematic perspective view illustrating an example of an electronic device.

FIG. 2 is a schematic perspective view illustrating an example of an electronic device.

Referring to FIG. 2, a semiconductor package 100 may be used for various purposes in the various electronic devices 1000 described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1130, may be accommodated in the body 1101. A portion of the electronic components 1120 may be chip-related components, as described above, and the semiconductor package 100 may be, for example, an application processor among the chip-related components, but is not limited thereto. The electronic device is not limited to the smartphone 1100, but may be other electronic devices described above.

Semiconductor Package

Generally, numerous microelectrical circuits are integrated in a semiconductor chip. However, the semiconductor chip itself may not serve as a finished semiconductor product, and may be damaged due to an external physical or chemical impact. Therefore, the semiconductor chip itself is not used, but is packaged and used in an electronic device, or the like, in a package state.

Semiconductor packaging is required due to a difference in a circuit width between the semiconductor chip and a main board of the electronic device with regard to electrical connectivity. In detail, a size of connection pads of the semiconductor chip and an interval between the connection pads may be very fine, but a size of component mounting pads of the main board used in the electronic device and an interval between the component mounting pads may be significantly larger than that of the semiconductor chip. Therefore, it may be difficult to directly mount the semiconductor chip on the main board, and a packaging technology for buffering a difference in a circuit width between the semiconductor chip and the main board may be required.

A semiconductor package manufactured using such a packaging technology may be divided into a fan-in semiconductor package and a fan-out semiconductor package, depending on a structure and a purpose thereof.

The fan-in semiconductor package and the fan-out semiconductor package will hereinafter be described in more detail, with reference to the drawings.

Fan-In Semiconductor Package

FIGS. 3A and 3B are schematic cross-sectional views illustrating states of a fan-in semiconductor package before and after being packaged.

Figure 4:
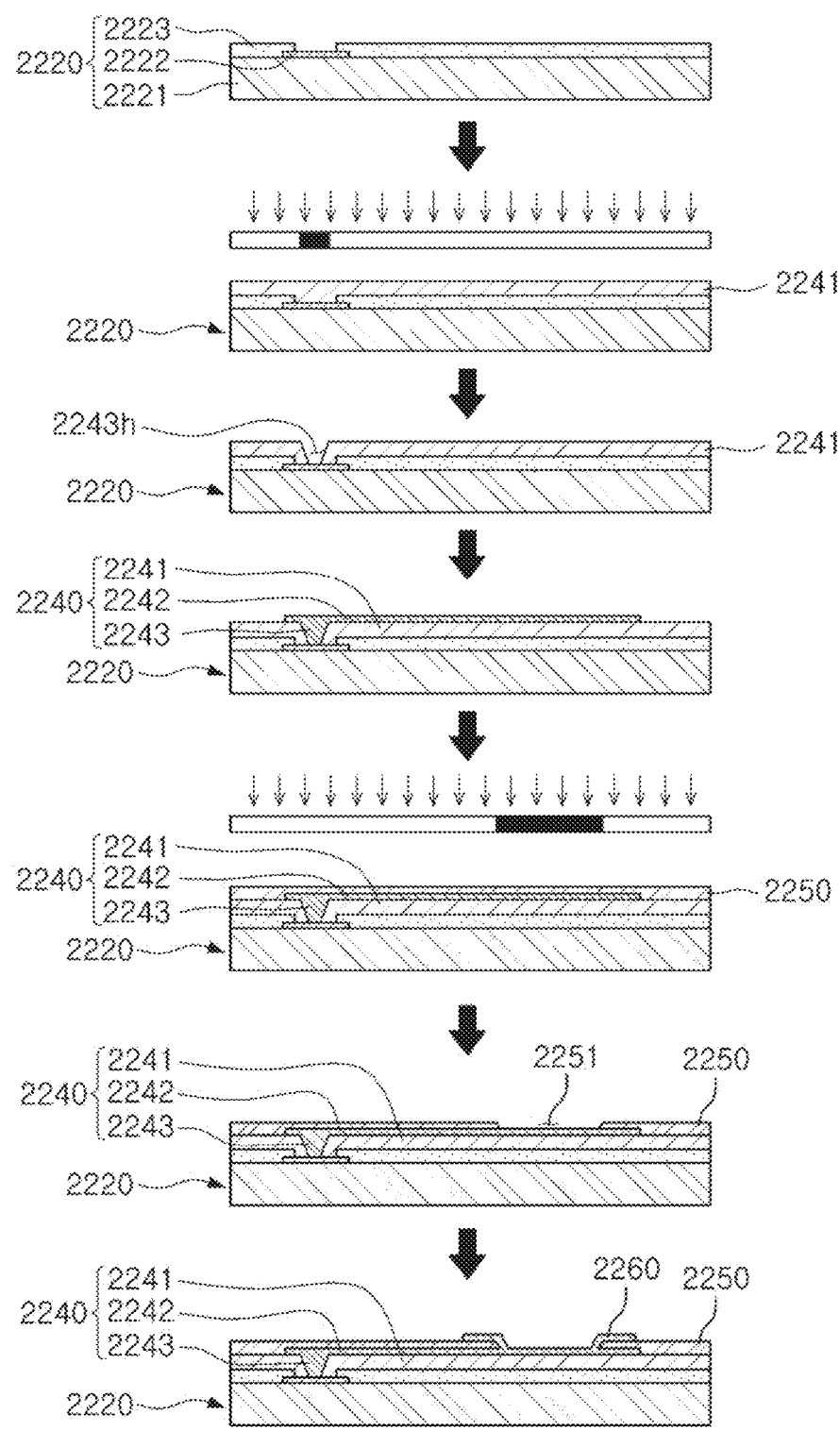
FIG. 4 illustrates schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, a connection pad 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pad 2222 is very small, it may be difficult to mount the IC on an intermediate level printed circuit board (PCB), as well as on a main board of an electronic device, or the like.

Therefore, depending on a size of the semiconductor chip 2220, an interconnection member 2240 may be formed on the semiconductor chip 2220 in order to redistribute the connection pad 2222. The interconnection member 2240 may be formed by forming an insulating layer 2241 on the semiconductor chip 2220, using an insulating material such as a photoimagable dielectric (PID) resin, forming a via hole 2243h opening the connection pad 2222, and then forming a wiring pattern 2242 and a via 2243. Then, a passivation layer 2250, protecting the interconnection member 2240, may be formed, an opening portion 2251 may be formed, and an underbump metal layer 2260, or the like, may be formed. That is, a fan-in semiconductor package 2200 including, for example, the semiconductor chip 2220, the interconnection member 2240, the passivation layer 2250, and the underbump metal layer 2260, may be manufactured through a series of processes.

As described above, the fan-in semiconductor package 2200 may have a package structure in which all of the connection pad 2222 of the semiconductor chip, for example, input/output (I/O) terminals, are disposed inwardly of the semiconductor chip, may have excellent electrical characteristics and may be produced at low cost. Therefore, many elements embedded in a smartphone have been manufactured in fan-in semiconductor package form. In detail, many elements embedded in the smartphone have been developed to allow for rapid signal transfer, while having a compact size.

However, since all of the I/O terminals are required to be disposed inwardly of the semiconductor chip in the fan-in semiconductor package, the fan-in semiconductor package may have a significant spatial limitation. Therefore, it may be difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that, even though a size of the I/O terminals of the semiconductor chip and an interval between the I/O terminals are increased through a redistribution process, the size and the interval may not be sufficient to directly mount the fan-in semiconductor package on the main board of the electronic device.

Figure 5:
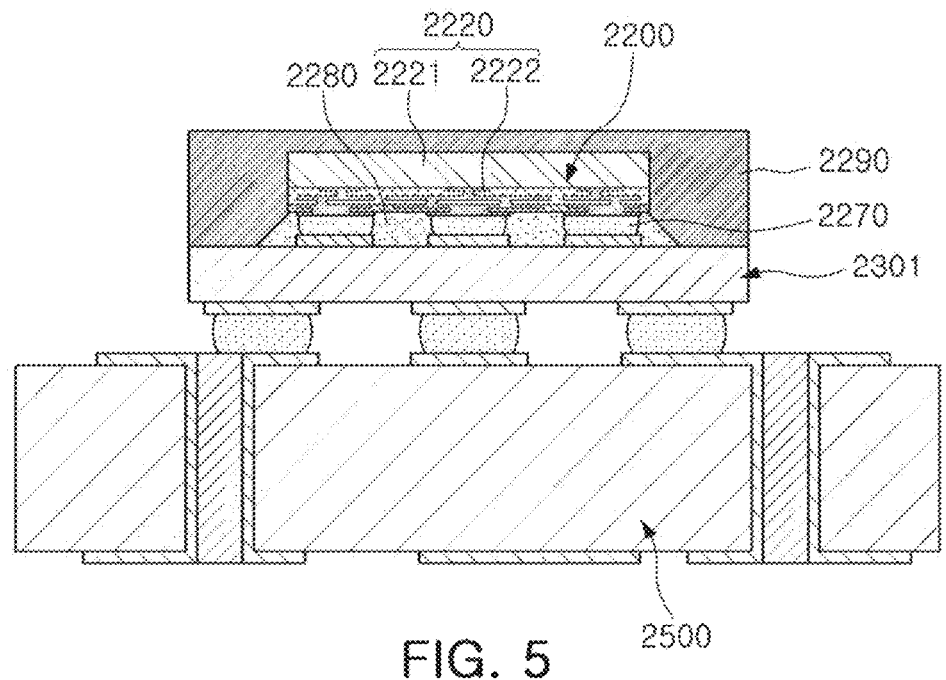
FIG. 5 is a schematic cross-sectional view illustrating a fan-in semiconductor package mounted on an interposer substrate and mounted, ultimately, on a main board of an electronic device.

FIG. 5 is a schematic cross-sectional view illustrating a fan-in semiconductor package mounted on an interposer substrate and mounted, ultimately, on a main board of an electronic device.

Figure 6:
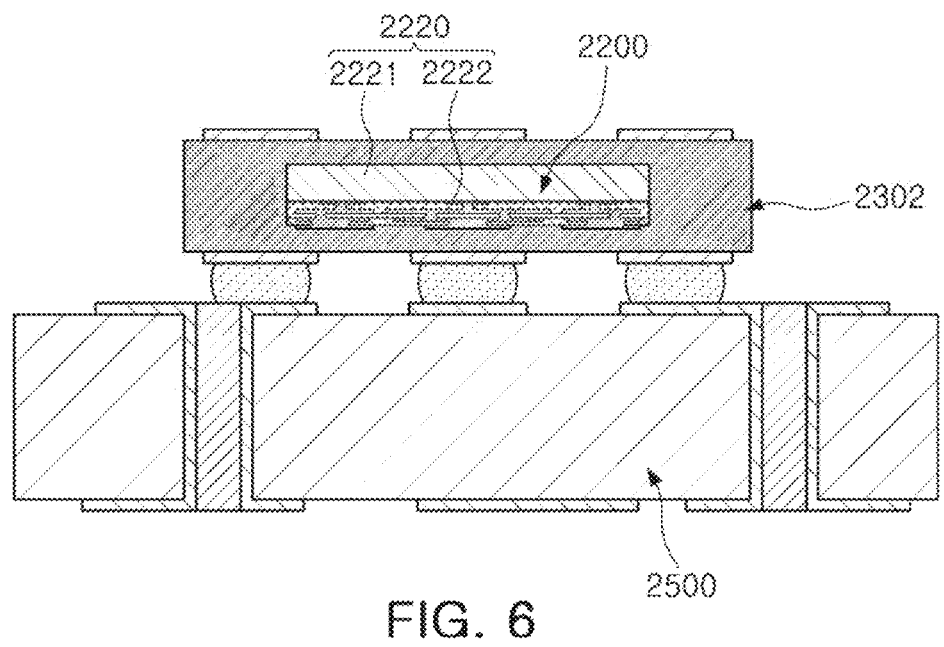
FIG. 6 is a schematic cross-sectional view illustrating a fan-in semiconductor package embedded in an interposer substrate and mounted, ultimately, on a main board of an electronic device.

FIG. 6 is a schematic cross-sectional view illustrating a fan-in semiconductor package embedded in an interposer substrate and mounted, ultimately, on a main board of an electronic device.

Referring to the drawings, in a fan-in semiconductor package 2200, connection pads 2222, for example, I/O terminals, of a semiconductor chip 2220, may be redistributed for a second time by an interposer substrate 2301, and the fan-in semiconductor package 2200 may be ultimately mounted on a main board 2500 of an electronic device, while being mounted on the interposer substrate 2301. Here, a solder ball 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, for example, I/O terminals, of the semiconductor chip 2220 maybe redistributed once more by the interposer substrate 2302 while being embedded in the interposer substrate 2302, and may be ultimately mounted on a main board 2500 of an electronic device.

As described above, it may be difficult to directly mount and use the fan-in semiconductor package 2200 on the main board 2500 of the electronic device. Therefore, the fan-in semiconductor package 2200 may be mounted on the separate interposer substrate 2301 and may then be mounted on the main board 2500 of the electronic device through a packaging process, or may be mounted and used on the main board 2500 of the electronic device while being embedded in the interposer substrate 2302.

Fan-Out Semiconductor Package

Figure 7:
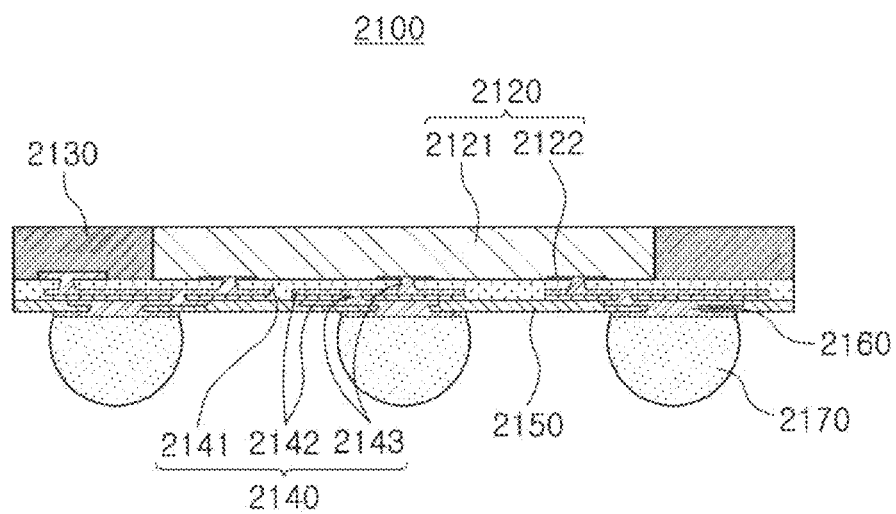
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and a connection pad 2122 of the semiconductor chip 2120 may be redistributed outwardly of the semiconductor chip 2120 by an interconnection member 2140. Here, a passivation layer 2150 may further be formed on the interconnection member 2140, and an underbump metal layer 2160 may further be formed in an opening portion of the passivation layer 2150. A solder ball 2170 may also be formed on the underbump metal layer 2160. The semiconductor chip 2120 may be an IC including a body 2121, the connection pad 2122, the passivation layer 2150, and the like. The interconnection member 2140 may include an insulating layer 2141, a redistribution layer 2142 formed on the insulating layer 2141, and a via 2143, electrically connecting the connection pad 2122 to the redistribution layer 2142.

As described above, the fan-out semiconductor package 2100 may have a structure in which I/O terminals of the semiconductor chip 2120 are redistributed outwardly of the semiconductor chip 2120 through the interconnection member 2140 formed on the semiconductor chip 2120. As described above, in the fan-in semiconductor package 2200, all of the I/O terminals of the semiconductor chip 2220 are required to be disposed inwardly of the semiconductor chip 2220. Therefore, when a size of the semiconductor chip 2220 is decreased, a size and a pitch of the solder ball 2270 are required to be reduced, so that a standardized solder ball layout may not be used in the fan-in semiconductor package 2200. On the other hand, the fan-out semiconductor package 2100 may have a structure in which the I/O terminals of the semiconductor chip 2120 are redistributed outwardly of the semiconductor chip 2120 by the interconnection member 2140 formed on the semiconductor chip 2120, as described above. Therefore, even when a size of the semiconductor chip 2120 is reduced, a standardized solder ball layout may be used in the fan-out semiconductor package 2100 as it is, so that the fan-out semiconductor package 2100 may be mounted on the main board 2500 of the electronic device without using a separate interposer substrate, as described below.

Figure 8:
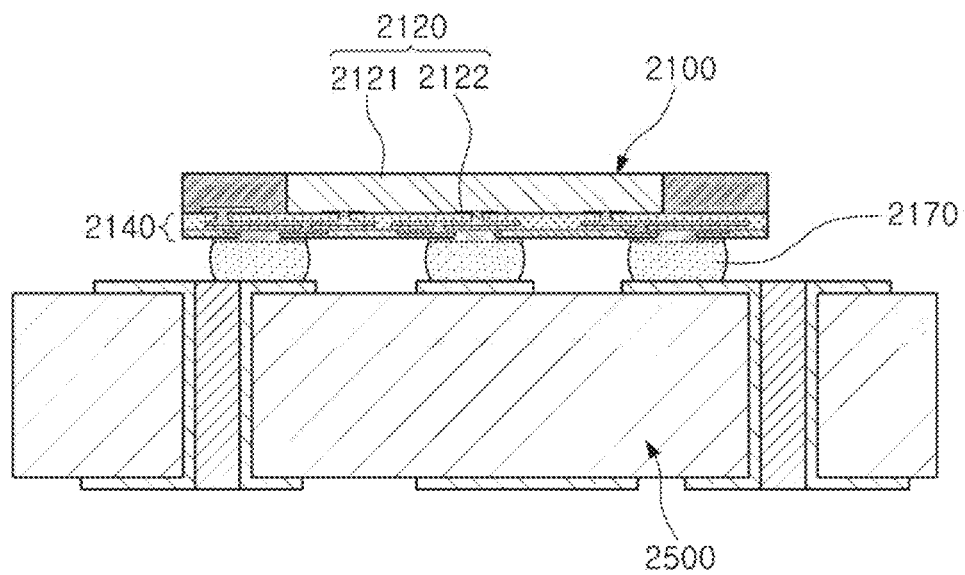
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, the fan-out semiconductor package 2100 may be mounted on the main board 2500 of the electronic device by the solder ball 2170, or the like. For example, as described above, the fan-out semiconductor package 2100 may include the interconnection member 2140 formed on the semiconductor chip 2120 to redistribute the connection pad 2122 to a fan-out region that is outside of the size of the semiconductor chip 2120, so that the standardized solder ball layout may be used in the fan-out semiconductor package 2100 as it is. As a result, the fan-out semiconductor package 2100 may be mounted on the main board 2500 of the electronic device without using the separate interposer substrate, or the like.

As described above, since the fan-out semiconductor package 2100 may be mounted on the main board 2500 of the electronic device without using the separate interposer substrate, the fan-out semiconductor package 2100 may be implemented to have a thickness less than that of the fan-in semiconductor package 2200 using the interposer substrate 2301 or 2302. Therefore, the fan-out semiconductor package 2100 may be miniaturized and thinned. In addition, the fan-out semiconductor package 2100 may have excellent thermal characteristics and electrical characteristics, so that it may be particularly appropriate for a mobile product. Therefore, the fan-out semiconductor package 2100 may be implemented in a form more compact than that of a general package-on-package (POP) type package using a PCB, and may prevent the occurrence of a warpage phenomenon.

Meanwhile, the fan-out semiconductor package 2100 refers to a package technology for mounting the semiconductor chip 2120 on the main board 2500 of the electronic device, or the like, as described above, and protecting the semiconductor chip 2120 from an external impact, the package technology being conceptually different from the package technology of a PCB such as an interposer substrate, or the like, having a scale, a purpose, and the like, different from those of the fan-out semiconductor package 2100, and having the fan-in semiconductor package 2200 embedded therein.

Hereinafter, a fan-out semiconductor package that may be applicable to a high-end product by reducing noise in signal transmission will be described, with reference to the drawings.

Figure 9:
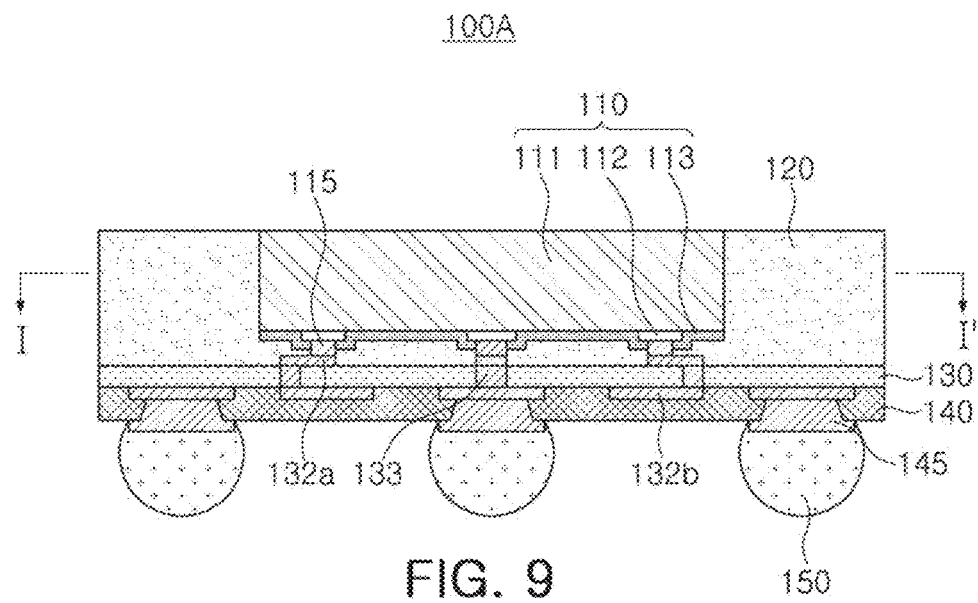
FIG. 9 is a schematic cross-sectional view illustrating an example of a fan-out semiconductor package.

FIG. 9 is a schematic cross-sectional view illustrating an example of a fan-out semiconductor package.

Figure 10:
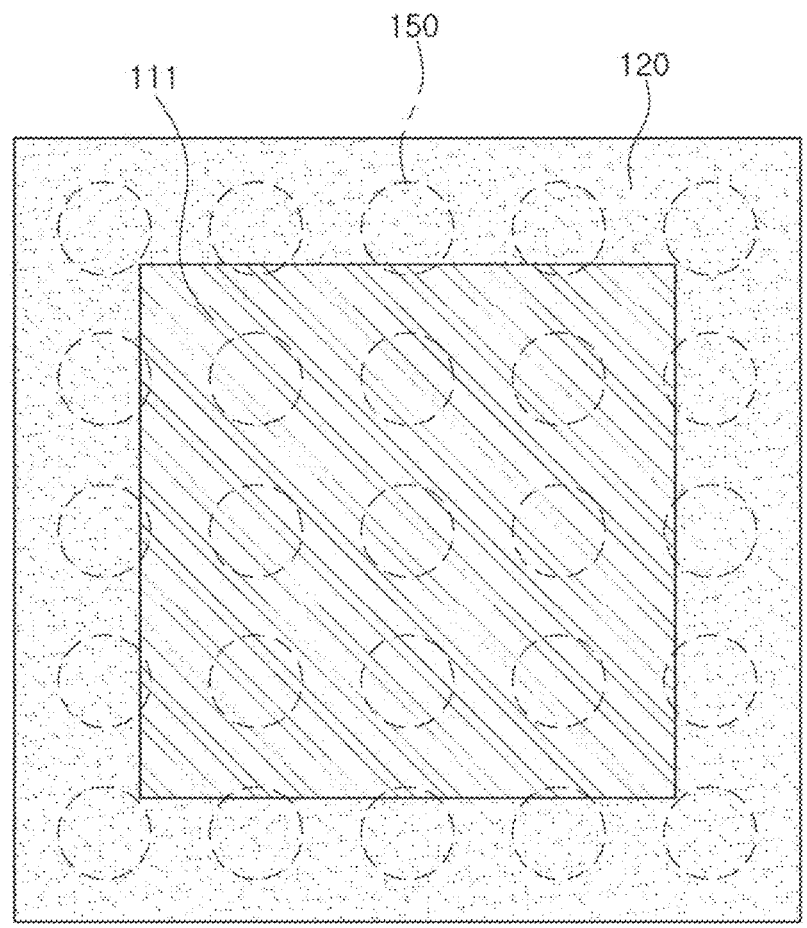
FIG. 10 is a schematic cut plan view taken along line I-I' of the fan-out semiconductor package of FIG. 9.

FIG. 10 is a schematic cut-away plan view taken along line I-I' of the fan-out semiconductor package of FIG. 9.

Referring to FIGS. 9 and 10, a fan-out semiconductor package 100A according to an embodiment may include a semiconductor chip 110 having an active surface, the active surface having a connection pad 112 disposed thereon, and an inactive surface opposing the active surface, an encapsulant 120 encapsulating at least a portion of the semiconductor chip 110, an insulating layer 130 disposed on the active surface of the semiconductor chip 110, a first redistribution layer 132a and a second redistribution layer 132b disposed on the insulating layer 130 and electrically connected to the connection pad 112, a via 133 passing through the insulating layer 130 and connecting the first redistribution layer 132a to the second redistribution layer 132b, a passivation layer 140 disposed on the insulating layer 130 and having an opening portion exposing at least a portion of the second redistribution layer 132b, an under-bump metal layer 145 disposed in the opening portion, and a connection terminal 150 disposed on the under-bump metal layer 145 and electrically connected to the first and second redistribution layers 132a and 132b.

The semiconductor chip 110 may be an IC, with hundreds to several millions of elements or more being integrated in a single chip. The IC may be a known semiconductor chip, for example, an application processor (AP) such as a central processor (for example, a CPU), a graphic processor (for example, a GPU), a digital signal processor, a cryptographic processor, a microprocessor, or a microcontroller, or may be a power management IC (PMIC). Alternatively, the IC may include both the AP and the PMIC. However, the present disclosure is not limited thereto.

The semiconductor chip 110 may include a body 111, the connection pad 112 formed on one surface of the body 111, and a passivation layer 113 formed on the surface of the body 111 to cover a portion of the connection pad 112. The body 111 may be formed, for example, based on an active wafer. In an embodiment, silicon (Si), germanium (Ge), gallium arsenide (GaAs), or the like, maybe used as a basic material of the body 111. The connection pad 112 may electrically connect the semiconductor chip 110 to another component, and may be formed of a conductive material, preferably aluminum (Al). The connection pad 112 may be redistributed by the first and second redistribution layers 132a and 132b. The 'active surface' may refer to one surface of the semiconductor chip 110 on which the connection pad 112 is formed, and the 'inactive surface' may refer to the other surface, opposing the surface of the semiconductor chip 110 on which the connection pad 112 is formed. The passivation layer 113 may protect the body 111 from the outside, and may be formed of, for example, an oxide layer such as silicon dioxide ($SiO_2$), or a nitride layer such as silicon nitride ($Si_3N_4$), or the like, or may be formed of a double layer of an oxide layer and a nitride layer. In addition, an insulating layer such as SiO or the like may further be disposed between the body 111 and the connection pad 112 or between the body 111 and the passivation layer 113.

The encapsulant 120 may protect the semiconductor chip 110, and may also secure the semiconductor chip 110. A shape of the encapsulant 120 is not particularly limited, as long as it covers at least a portion of the semiconductor chip 110. For example, the encapsulant 120 may surround a lateral surface of the semiconductor chip 110, and may expose the inactive surface thereof. An upper surface of the encapsulant 120 may be disposed on the same level as the inactive surface of the semiconductor chip 110. The encapsulant 120 may fill a space between the passivation layer 113 of the semiconductor chip 110 and the insulating layer 130.

A material of the encapsulant 120 is not particularly limited, and may be, for example, an insulating material. In more detail, for example, an Ajinomoto build-up film (ABF) or the like, which includes an inorganic filler and an insulating resin, but does not include glass cloth, maybe used as a material of the encapsulant 120. However, the present disclosure is not limited thereto, and a known epoxy molding compound (EMC) may also be used as a material of the encapsulant 120.

The insulating layer 130 may be provided to form the first and second redistribution layers 132a and 132b. In an embodiment, the insulating layer 130 may include a low Df dielectric material. When the insulating layer 130 having the first and second redistribution layers 132a and 132b disposed thereon includes a low Df dielectric material, noise in signal transmission may be reduced. Therefore, in a high frequency domain of, for example, 60 GHz or more, a signal may be transmitted at a very high rate. The low Df dielectric material may have a tan delta(Df) range of about 0.0001 to about 0.006, and more preferably about 0.0001 to about 0.004, which is measured at 10 GHz to 20 GHz . A material of the low Df dielectric material is not particularly limited as long as the dielectric material may satisfy the above-mentioned tan delta range while having insulating properties. For example, the low Df dielectric material may include at least one of polyimide (PI), cycloolefinpolymer (COP), polyphenyleneoxide (PPO), polyphenyleneether (PPE), epoxy-cyanate ester, or liquid crystal polymer (LCP), but has a tan delta range of about 0.001 to about 0.006. A thickness of the insulating layer 130 is not particularly limited, and may range, for example, from about 5 μm to about 100 μm.

A surface of the insulating layer 130 which fine patterns are formed thereon, may have a surface roughness (Ra) of 0.10 μm or less. For example, a surface of the insulating layer 130 which fine patterns are formed thereon, may be modified by irradiation of ultraviolet (UV) light having a wavelength of, for example, about 185 nm or about 254 nm, to increase adhesion thereof. As a result, the first and second redistribution layers 132a and 132b may be quickly and simply formed on the insulating layer 130 as micropatterns by electroless copper plating. The insulating layer 130 may include multiple layers, unlike in FIG. 9. Here, a redistribution layer may be disposed between a multilayer insulating layer.

The first and second redistribution layers 132a and 132b may redistribute the connection pad 112 of the semiconductor chip 110 to electrically connect the connection pad 112 to the connection terminal 150. The first and second redistribution layers 132a and 132b may be formed on the surface of the insulating layer 130 by electroless copper plating. That is, the first and second redistribution layers 132a and 132b may include electroless plated copper. However, the present disclosure is not limited thereto, and the first and second redistribution layers 132a and 132b may include a conductive material other than copper (Cu). The first and second redistribution layers 132a and 132b may perform various functions, depending on designs thereof. For example, the first and second redistribution layers 132a and 132b may include a ground (GND) pattern, a power (PWR) pattern, a signal (S) pattern, and the like. The signal (S) pattern may include various signals, such as data signals, and the like, except for the GND pattern, the PWR pattern, and the like. In addition, the first and second redistribution layers 132a and 132b may include a via pad, a connection terminal pad, and the like.

The first redistribution layer 132a may be disposed on a first surface of the insulating layer 130, which contacts the encapsulant 120, and the second redistribution layer 132b may be disposed on a second surface of the insulating layer 130 opposing the first surface. The first redistribution layer 132a may be connected to the connection pad 112 of the semiconductor chip 110 through a separate interconnection member 115. The interconnection member 115 may be a known copper (Cu) post, a conductive bump, and the like.

The via 133 may pass through the insulating layer 130 to electrically connect the first and second redistribution layers 132a and 132b disposed on the first and second surfaces of the insulating layer 130, respectively. The via 133 may also include electroless plated copper. However, the present disclosure is not limited thereto, and the first and second redistribution layers 132a and 132b may include a conductive material other than copper (Cu). A shape of the via 133 is not particularly limited, and the via 133 may have various shapes such as a tapered shape, a cylindrical shape, and the like.

The passivation layer 140 may be an additional component protecting the insulating layer 130, the first and second redistribution layers 132a and 132b, and the like, from external physical or chemical damage. The passivation layer 140 may have the opening portion exposing at least a portion of the second redistribution layer 132b. The opening portion may expose the entirety or only a portion of a surface of the second redistribution layer 132b, and may also expose a lateral surface thereof, in some cases. A material of the passivation layer 140 is not particularly limited, and may be, for example, a photosensitive insulating material such as a photosensitive insulating resin. Alternatively, a solder resist may be used as a material of the passivation layer 140. Again, alternatively, an insulating resin that does not include glass cloth but is impregnated with a filler, for example, an ABF including an inorganic filler and an epoxy resin, may also be used as a material of the passivation layer 140.

The under-bump metal layer 145 may be an additional component increasing connection reliability of the connection terminal 150 and thus improving board level reliability of the fan-out semiconductor package 100A. The underbump metal layer 145 may also be disposed in the opening portion of the passivation layer 140. The under-bump metal layer 145 may be formed through a metallization process using a known metal.

The connection terminal 150 may be a component physically or electrically connecting the fan-out semiconductor package 100A to an external power source. For example, the fan-out semiconductor package 100A may be mounted on the main board of the electronic device by the connection terminal 150. The connection terminal 150 may be formed of a conductive material, for example, a solder or the like. However, this is only an example, and a material of the connection terminal 170 is not limited thereto. The connection terminal 150 may be a land, a ball, a pin, or the like. The connection terminal 150 may include a single layer or a plurality of layers. When the connection terminal 170 includes the plurality of layers, the connection terminal 170 may include a copper pillar and a solder. When the connection terminal 170 includes the single layer, the connection terminal 170 may include a tin-silver solder or copper. However, this is only an example, and a material of the connection terminal 170 is not limited thereto. The number, interval, disposition, or the like, of connection terminals 150 is not particularly limited, and may be sufficiently modified by a person skilled in the art, depending on design particulars. For example, the connection terminal 150 may be provided in an amount of several tens to several thousands, according to the number of connection pads 112 of the semiconductor chip 110. The connection terminal 150 is not limited thereto, and may also be provided in an amount of several tens to several thousands or more.

At least one connection terminal 150 may be disposed in a fan-out region. The fan-out region refers to a region except the region in which the semiconductor chip 110 is disposed. For example, the fan-out semiconductor package 100A according to an embodiment may be a fan-out package. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be mounted on the electronic device without using a separate substrate. Thus, the fan-out package may be manufactured to have a reduced thickness, and may have excellent price competitiveness.

Figure 11:
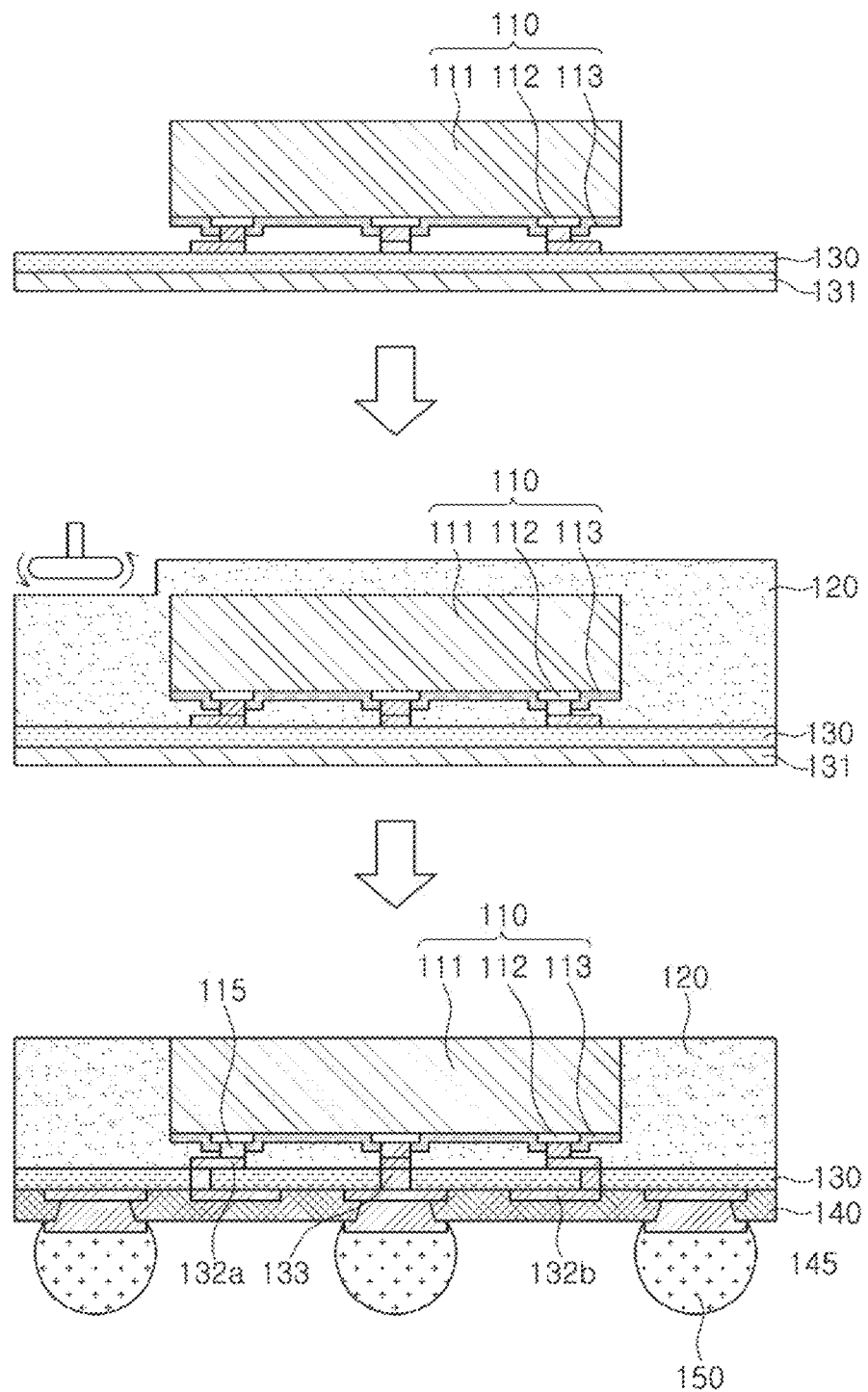
FIG. 11 illustrates schematic cross-sectional views illustrating an example of manufacturing the fan-out semiconductor package of FIG. 9.

FIG. 11 is schematic cross-sectional views illustrating an example of manufacturing the fan-out semiconductor package of FIG. 9.

Referring to FIG. 11, the insulating layer 130, having the first redistribution layer 132a disposed on the first surface thereof and a plated layer 131 disposed on the second surface thereof, may be provided. The semiconductor chip 110 may be disposed on the insulating layer 130 such that the connection pad 112 maybe connected to the first redistribution layer 132a. The connection pad 112 may be connected to the first redistribution layer 132a using the interconnection member 115. A surface of the insulating layer 130 forming fine patters may be subjected to a UV light irradiation treatment or the like, and the surface may have a surface roughness (Ra) of 0.10 μm or less. Thus, the first redistribution layer 132a and the plated layer 131 may be formed using electroless copper plating.

Subsequently, the semiconductor chip 110 may be encapsulated by the encapsulant 120. The encapsulation method is not particularly limited, and may include, for example, forming a material of the encapsulant 120 on the insulating layer 130, using a known lamination or coating method, and curing the material. In order to adjust a thickness of the fan-out semiconductor package 100A, an upper portion of the encapsulant 120 may be ground. For example, the upper portion of the encapsulant 120 may be ground to expose the inactive surface of the semiconductor chip 110. A known method may be used as the grinding method.

Subsequently, the second redistribution layer 132b and the via 133 may be formed using the plated layer 131. A surface of the insulating layer 130 may be subjected to a UV light irradiation treatment or the like, and the surface may have a surface roughness (Ra) of 0.10 μm or less. Thus, the second redistribution layer 132b and the via 133 may also be formed using electroless copper plating. The passivation layer 140 may be formed using a known lamination or coating method. Depending on a material of the passivation layer 140, the opening portion thereof may be formed using laser drilling or mechanical drilling, or a photolithography method, and then the under-bump metal layer 145 may be formed in the opening portion using a known metallization method. The connection terminal 150 may be formed on the under-bump metal layer 145 using a known method. As a result, the fan-out semiconductor package 100A may be manufactured.

In some cases, the fan-out semiconductor package 100A may also be manufactured in a sequence in which the first redistribution layer 132a, the second redistribution layer 132b, and the via 133 may be formed on the insulating layer 130, the semiconductor chip 110 may be disposed on the insulating layer 130, and the semiconductor chip 110 may be encapsulated by the encapsulant 120. However, the manufacturing sequence of the fan-out semiconductor package 100A according to an embodiment may be appropriately changed as desired.

Figure 12:
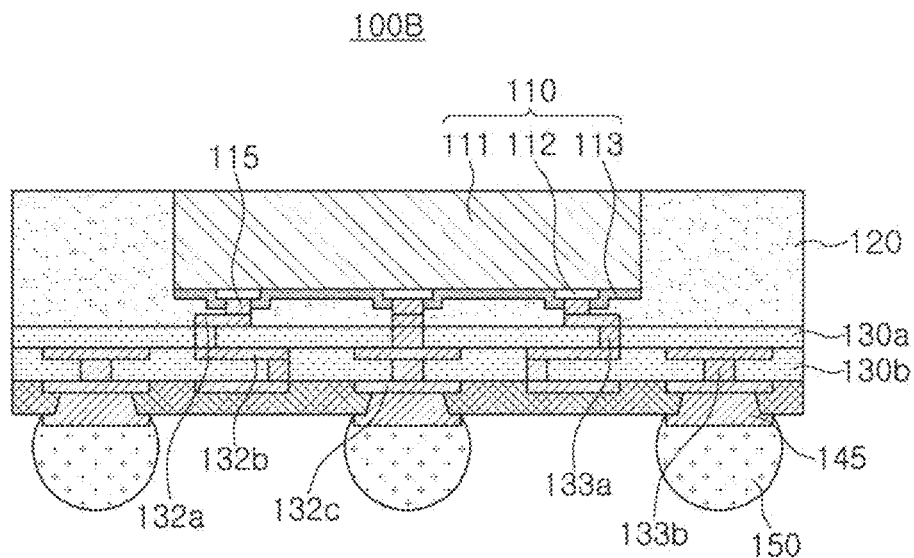
FIG. 12 is a schematic cross-sectional view illustrating another example of a fan-out semiconductor package.

FIG. 12 is a schematic cross-sectional view illustrating another example of a fan-out semiconductor package.

Referring to FIG. 12, a fan-out semiconductor package 100B according to another example may include a plurality of insulating layers 130a and 130b, redistribution layers 132a, 132b, and 132c in a larger number than the first and second redistribution layers 132a and 132b of the fan-out semiconductor package 100A, and vias 133a and 133b. As described above, the insulating layers 130a and 130b, the redistribution layers 132a, 132b, and 132c, and the vias 133a and 133b may be further formed, as desired. Descriptions of configurations overlapping the above-mentioned configuration will be omitted.

Figure 13:
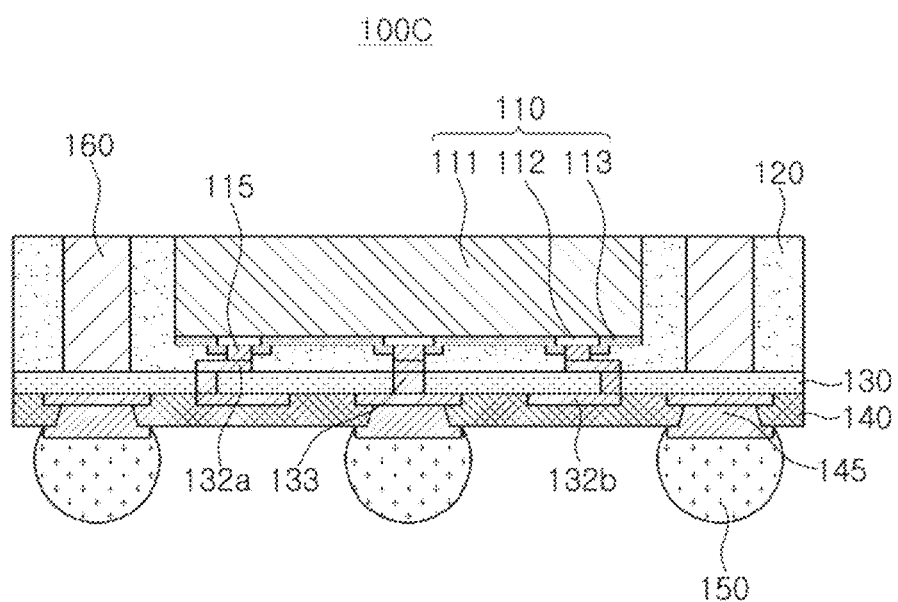
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, a fan-out semiconductor package 100C according to an example may further include a heat dissipation member 160, disposed on a lateral portion of a semiconductor chip 110. The heat dissipating member 160 may externally dissipate heat generated by high-speed signal transmission. The heat dissipating member 160 may be in the form of a heat dissipation via including copper (Cu), or the like, or may be in the form of a metal chip including SUS, invar, or the like. At least a portion of the dissipating member 160 may be encapsulated by an encapsulant 120. Here, the encapsulant 120 may expose an upper surface of the heat dissipation member 160. For example, an upper surface of the encapsulant 120 may be disposed on the same level as the upper surface of the heat dissipation member 160. This is the reason that, after the heat dissipation member 160 is encapsulated by the encapsulant 120, the heat dissipation member 160 may be ground, along with the encapsulant 120, when grinding the encapsulant 120.

Figure 14:
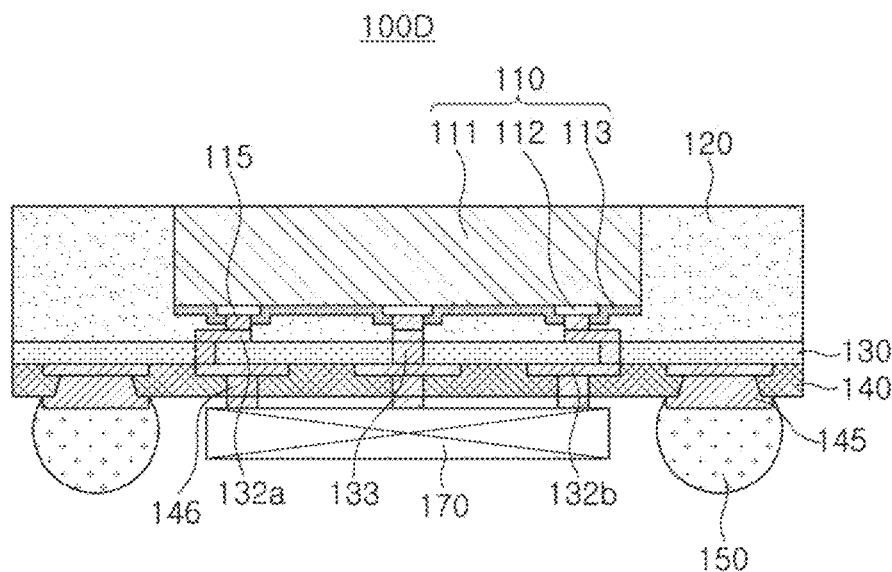
FIG. 14 is a schematic cross-sectional view illustrating another example of a fan-out semiconductor package.

FIG. 14 is a schematic cross-sectional view illustrating another example of a fan-out semiconductor package.

Referring to FIG. 14, a fan-out semiconductor package 100D according to another example may further include a surface-mount technology (SMT) component 170 disposed on a surface of a passivation layer 140. The SMT component 170 may be electrically connected to a second redistribution layer 132b by an interconnection member 146, to thus be electrically connected to a semiconductor chip 110. The SMT component 170 may be a known active component or passive component, and, in some cases, may be another semiconductor chip.

Figure 15:
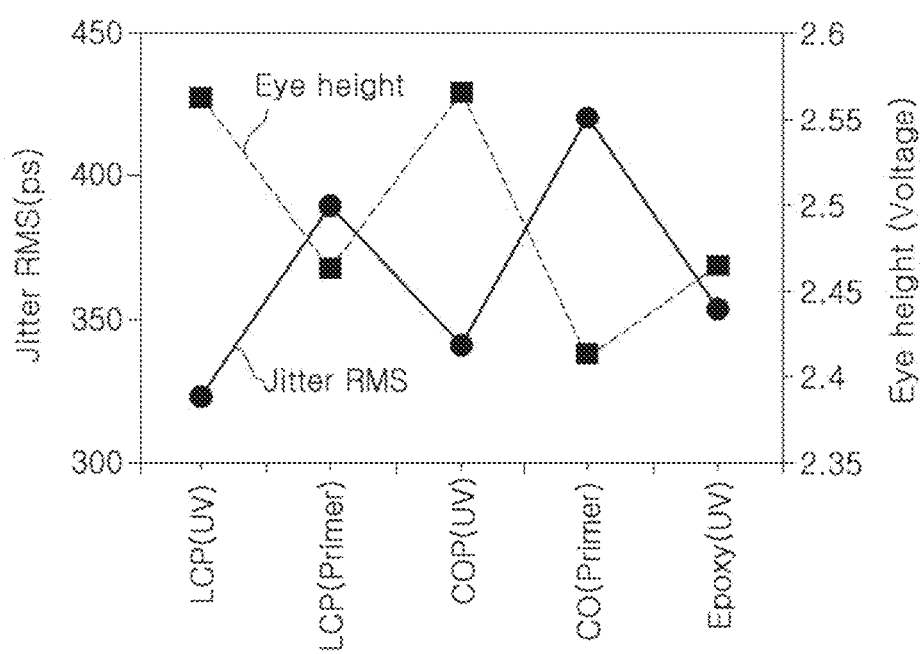
FIG. 15 is a graph illustrating results of signal loss according to tan delta values of an insulating layer.

FIG. 15 is a graph illustrating results of signal loss according to tan delta values of an insulating layer.

Referring to FIG. 15, when a liquid crystal polymer (LCP) (a tan delta of 0.002, and UV light irradiation or primer surface treatment) and a cyclo olefin polymer (COP) (a tan delta of 0.0004, and UV light irradiation or primer surface treatment) having a tan delta range of 0.0001 to 0.006 are used as a material of an insulating layer, signal loss may be low, as compared to when an epoxy resin (a tan delta of 0.0073, and UV light irradiation surface treatment) having a tan delta range of more than 0.006 is used as a material of the insulating layer The signal loss was measured using eye height (unit: voltage) and jitter RMS (unit: ps) indicating a degree of signal noise. The measurement was performed using an Agilent Infinium DCA 86100A oscilloscope and an Agilent 54754 differential TDR module under conditions of L: 111.5 mm, W: 100 μm, and S: 55 μm.

Figure 16:
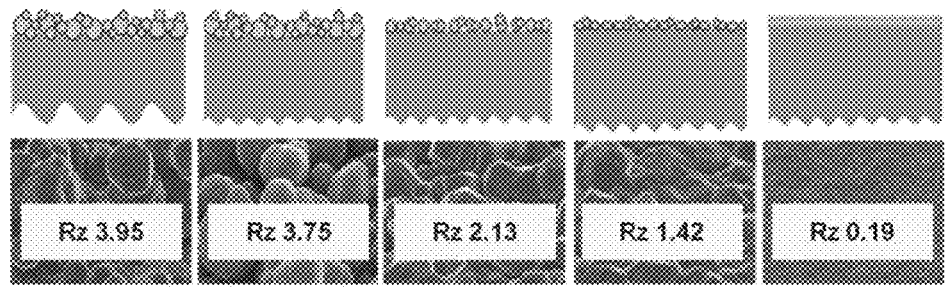
FIG. 16 is a graph illustrating surface roughness of a copper foil according to surface roughness of an insulating layer.

FIG. 16 is a graph illustrating surface roughness of a copper foil according to surface roughness of an insulating layer.

Referring to FIG. 16, when a surface roughness (Rz) of an insulating layer having a tan delta range of 0.0001 to 0.006 is 0.19, that is, a surface roughness (Ra) thereof is 0.10 μm or less, a copper foil may be formed to have a planar shape and excellent adhesion as a plated layer. Conversely, when a surface roughness (Rz) of the insulating layer exceeds 0.20, that is, a surface roughness (Ra) thereof exceeds 0.10 μm, the copper foil may not be properly formed as a plated layer, and may have a significantly rough surface.

Figure 17:
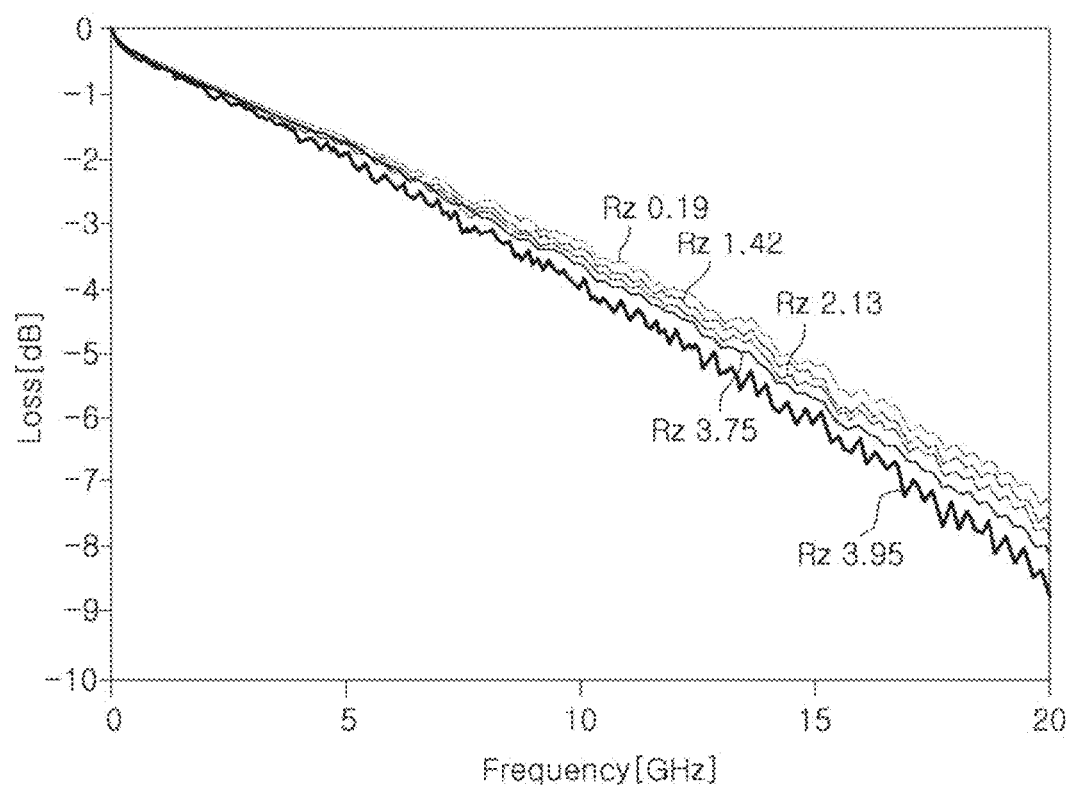
FIGS. 17 and 18 are graphs illustrating the influence of surface roughness of a copper foil on signal loss.
Figure 18:
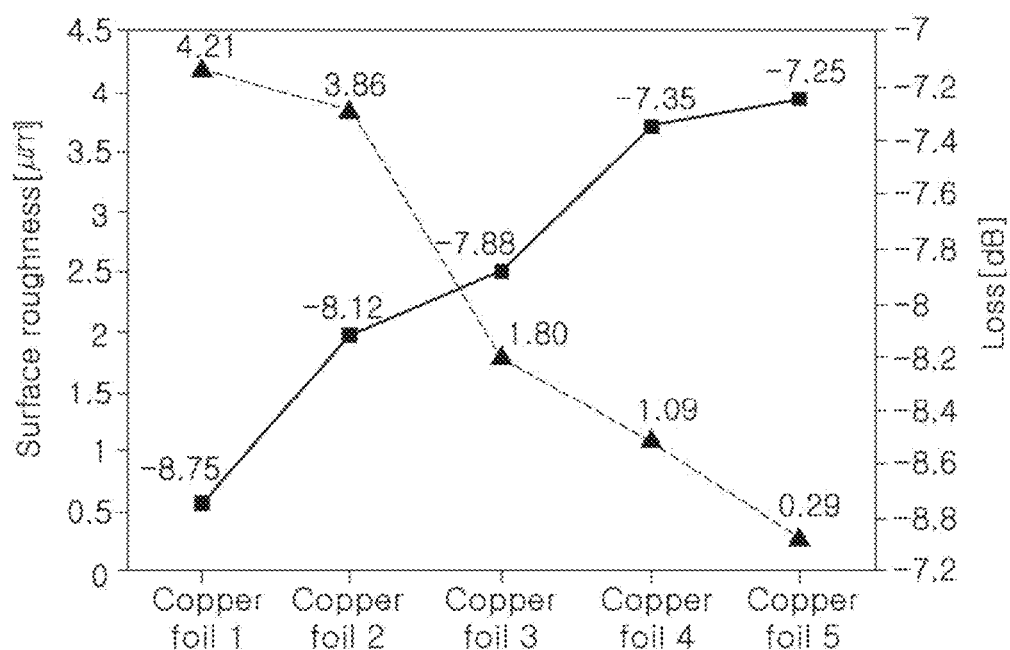

FIGS. 17 and 18 are graphs illustrating the influence of surface roughness of a copper foil on signal loss.

Referring to FIG. 17, when a surface roughness (Rz) of an insulating layer having a tan delta range of 0.0001 to 0.006 in a high frequency domain is high, surface roughness of a copper foil may be high. Therefore, signal loss may be relatively increased.

Figure 19:
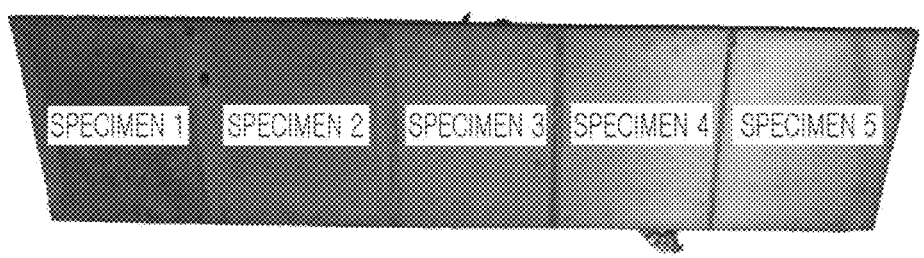
FIG. 19 is an image illustrating the results of plating according to an ultraviolet (UV) light treatment.

FIG. 19 is an image illustrating the results of plating according to an UV light irradiation treatment.

Referring to FIG. 19, when an dielectric material having a tan delta range of 0.0001 to 0.006 is used as a material of an insulating layer, if the insulating layer is not irradiated with UV light having a wavelength of, for example, 185 nm or 254 nm, it maybe almost impossible to coat the insulating layer with a copper foil (UV light irradiation time: 0 second, P/S: non-plated). When the insulating layer is irradiated with the UV light having the wavelength of, for example, 185 nm or 254 nm, adhesion thereof may be increased, to thus enable the insulating layer to be coated with the copper foil (UV light irradiation time: 10 to 90 seconds, P/S: 0.422 kgf/cm to 0.336 kgf/cm). Specimen 1 was not plated, under conditions of a UV light irradiation time of 0 seconds; Specimen 2 was plated under conditions of a UV light irradiation time of 10 seconds and 0.422 kgf/cm; Specimen 3 was plated under conditions of a UV light irradiation time of 30 seconds and 0.494 kgf/cm; Specimen 4 was plated under conditions of a UV light irradiation time of 60 seconds and 0.354 kgf/cm; and Specimen 5 was plated under conditions of a UV light irradiation time of 90 seconds and 0.336 kgf/cm. A UV light irradiation distance was 30 mm, and electroless copper plating was used as the plating.

As set forth above, according to an embodiment, a fan-out semiconductor package which may apply to high-end products by reducing noise in signal transmission may be provided.

While exemplary embodiments have been shown and described above, it will be apparent to those skilled in the art that modifications and variations could be made without departing from the scope of the present invention, as defined by the appended claims.

What is claimed is:

1. A semiconductor package comprising:
a semiconductor chip having an active surface and an inactive surface opposing the active surface, the active surface having a connection pad disposed thereon;
an encapsulant encapsulating at least a portion of the semiconductor chip;
an insulating layer disposed on the active surface of the semiconductor chip, wherein the connection pad is disposed between the insulating layer and the inactive surface;
a redistribution layer disposed on the insulating layer and electrically connected to the connection pad; and
a heat dissipation member partially embedded in the encapsulant, disposed on a lateral portion of the semiconductor chip, and disposed on a level between the inactive surface of the semiconductor chip and the insulating layer,
wherein the heat dissipation member is electrically isolated from the redistribution layer and the connection pad of the semiconductor chip.

2. The semiconductor package of claim 1, wherein the encapsulant exposes an upper surface of the heat dissipation member.

3. The semiconductor package of claim 2, wherein an upper surface of the encapsulant is disposed on the same level as the upper surface of the heat dissipation member.

4. The semiconductor package of claim 3, wherein the heat dissipation member penetrates through the encapsulant and is in contact with the insulating layer.

5. The semiconductor package of claim 1, wherein the insulating layer comprises a dielectric material having a tan delta of 0.0001 to 0.006.

6. The semiconductor package of claim 1, wherein a surface of the insulating layer has a surface roughness (Ra) of 0.10 μm or less, and the redistribution layer is disposed on the surface having Ra of 0.10 μm or less.

7. The semiconductor package of claim 1, wherein the dielectric material comprises at least one of polyimide (PI), cycloolefinpolymer (COP), polyphenyleneoxide (PPO), polyphenyleneether (PPE), epoxy-cyanate ester, and liquid crystal polymer (LCP).

8. The semiconductor package of claim 1, further comprising:
a passivation layer disposed on the insulating layer and having an opening portion exposing at least a portion of the redistribution layer;
an under-bump metal layer disposed on the opening portion of the passivation layer; and
connection terminals disposed on the under-bump metal layer and electrically connected to the redistribution layer, wherein at least one of the connection terminals is disposed in a fan-out region.

9. The semiconductor package of claim 8, further comprising: a surface mount technology (SMT) component disposed on a surface of the passivation layer and electrically connected to the semiconductor chip.

10. The semiconductor package of claim 1, wherein the insulating layer comprises a first surface contacting the encapsulant and a second surface opposing the first surface, the redistribution layer comprises a first redistribution layer and a second redistribution layer disposed on the first surface and the second surface, respectively, and the first redistribution layer and the second redistribution layer are electrically connected to each other through a via passing through the insulating layer.

* * * * *